United States Patent [19]
Ratcliff

[11] Patent Number: 4,554,477
[45] Date of Patent: Nov. 19, 1985

[54] DRIVE CIRCUIT FOR A PLURALITY OF ULTRASONIC GENERATORS USING AUTO FOLLOW AND FREQUENCY SWEEP

[76] Inventor: Henry K. Ratcliff, 14 Hadfield Ave., Hoylake, Wirral, Merseyside L47 3DJ, England

[21] Appl. No.: 554,908

[22] Filed: Nov. 25, 1983

[51] Int. Cl.[4] .............................................. H01L 41/08

[52] U.S. Cl. .................................... 310/316; 310/317; 310/26; 318/116; 318/118

[58] Field of Search ......................... 310/26, 316, 317; 318/116, 118

[56] References Cited

U.S. PATENT DOCUMENTS

| | | | |
|---|---|---|---|
| 3,582,733 | 6/1971 | Brubaker | 318/116 |
| 3,638,087 | 1/1972 | Ratcliff | 318/118 |
| 3,694,713 | 9/1972 | Duren et al. | 318/118 X |
| 3,866,068 | 2/1975 | Krenicki et al. | 310/116 |
| 3,980,906 | 9/1976 | Kuris et al. | 310/116 |
| 4,275,363 | 6/1981 | Mishiro et al. | 318/116 X |
| 4,389,601 | 6/1983 | Sullivan | 318/116 X |

*Primary Examiner*—Mark O. Budd
*Attorney, Agent, or Firm*—Staas & Halsey

[57] ABSTRACT

A circuit for driving a plurality of ultrasonic transducers uses an oscillator drive means, first means responsive to the current supplied to the transducers is fed back to vary the oscillator frequency to maintain the transducer current at a maximum level, and second means, independent of the first means, are provided to cyclically sweep between upper and lower limits the oscillator frequency determined by the first means. This assures that each transducer experience resonance at least once each sweep.

4 Claims, 8 Drawing Figures

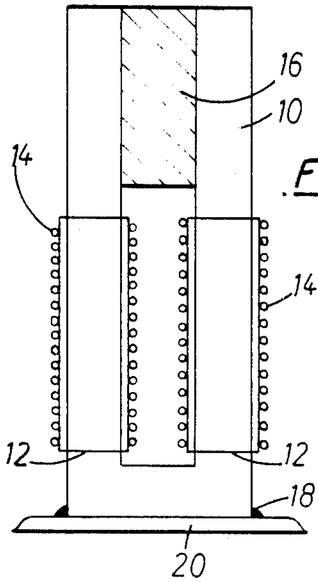
Fig 1
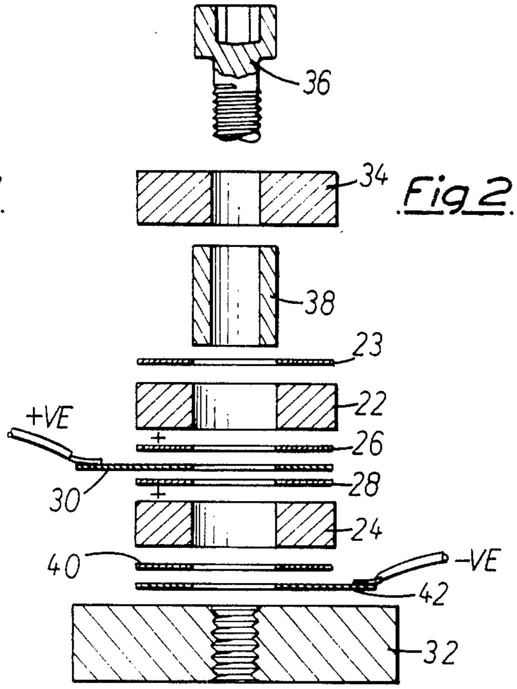
Fig 2
Fig 3
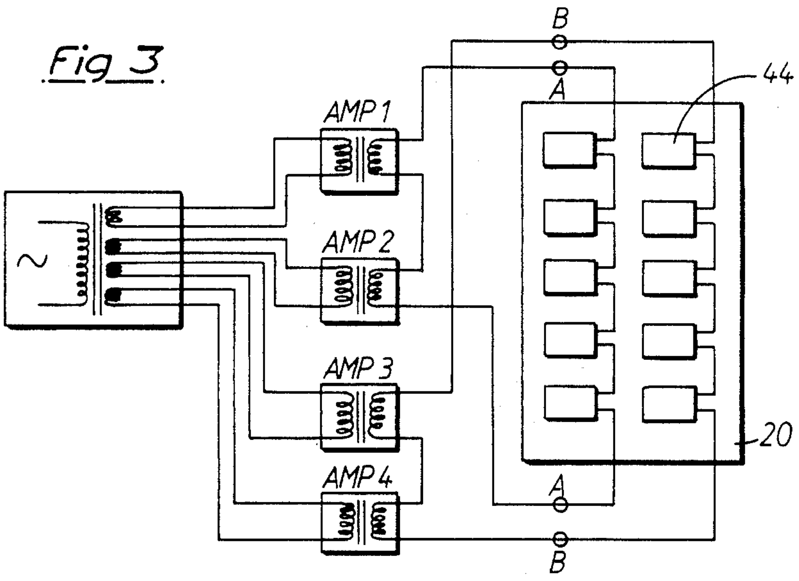

DRIVE CIRCUIT FOR A PLURALITY OF ULTRASONIC GENERATORS USING AUTO FOLLOW AND FREQUENCY SWEEP

BACKGROUND OF THE INVENTION

The present invention relates to ultrasonic generators and is concerned in particular with such generators used in ultrasonic cleaning systems.

Ultrasonic cleaning systems employ one or more transducers mounted on or within a liquid-containing chamber into which articles to be cleaned are placed. The liquid is usually water dosed with suitable chemicals, such as soaps and detergents, for washing the articles in the chamber. To assist in dislodging dirt, oil, grease etc. from the articles the transducer is caused to transmit ultrasonic vibrations to the articles via the liquid.

Conventional ultrasonic transducers fall into two principal types. The first type, which has been used for the last thirty years or so, is the magnetostrictive variety which employs a stack of metal laminations carrying a coil which is electrically excited by an alternating current. The laminations are arranged to be mechanically coupled to the body of a liquid-containing tank whereby ultrasonic vibrations generated in the laminated stack are transferred to articles placed in the tank via the tank body and the liquid.

A more recent type of ultrasonic transducer operates on the piezo-electric principle and comprises one or more piezo discs bonded to the tank via a metal diaphragm plate and adapted to be subjected to a high level alternating voltage.

The operating characteristics of these two types of device are somewhat different. Piezo electric elements are essentially capacitive devices and can be driven by very high voltage waves. Because of their high deflection capability and because they are voltage operated, piezo-transducers can be driven efficiently off mechanical resonance by using higher drive voltages than would be needed at resonance. Although this imposes greater electrical stress on the piezo devices, it does not significantly reduce their operational efficiency.

In contrast, magnetostrictive transducers are essentially current operated devices and their operation is limited by I2R losses in the windings. Furthermore, they have a very much smaller vibration amplitude limit than piezo transducers and greater losses within the driving material. Thus, efficiencies of the order of 50% have to be tolerated in comparison with about 90% for a piezo system.

The piezo transducer is, however, at a mechanical disadvantage. Failure of the piezo-elements themselves, failure of the epoxy bond to the diaphragm plate and erosion of the diaphragm plate itself, are all common, whereas magnetostrictive transducers are exceedingly strong and reliable devices capable of a long operational life in arduous conditions without failure. Thus, there is a high incentive to utilise magnetrostrictive transducers where possible.

However, magnetostrictive transducers have another associated problem in practice which has traditionally reduced their effectiveness. In order to achieve the necessary cleaning power, a number of magnetostrictive transducers are usually mounted together on a common diaphragm plate. For example, one diaphragm plate might carry two banks of transducers, with five series connected transducers in each bank. A serious problem which results arises from the variation in resonant frequencies between one stack and the next and between the individual transducers in each bank caused by the inevitable slight differences in the mechanical characteristics of each transducer and in, for example, the thickness of the brazing used to attach them to the diaphragm plate and in the relative positions of the transducers on the diaphragm plate which results in different loadings.

The traditional means of operating such transducers has been to drive them with a low-level oscillator preset to a fixed frequency that gives the peak power, as measured by input current to the system. However, in operation of such a system, the mechanical dimensions of the transducer assembly will inevitably vary, for example due to temperature variations, and the resonant condition is consequently lost, with a corresponding drop in operating efficiency. In consequence, the overall performance is particularly poor in comparison with a conventional piezo system.

SUMMARY OF THE INVENTION

It is one object of the present invention to improve the means of driving ultrasonic transucers so as to increase their operating efficiencies, particularly, although not exclusively in the case of magnetostrictive devices.

In accordance with one aspect thereof, the present invention resides in an ultrasonic generator for driving a plurality of ultrasonic transducers, comprising an electronic oscillator which provides an A.C. signal for driving said transducers, first means responsive to the current supplied to the transducers for varying the oscillator frequency to maintain the transducer current at a maximum level and second means which operate independently of said first means to cyclically sweep between upper and lower limits the oscillator frequency determined by said first means.

In this manner it can be ensured that each transducer in said plurality of transducers "peaks", i.e. experiences mechanical resonance and peak operating efficiency, at least once in each sweep.

BRIEF DESCRIPTION OF THE DRAWINGS

The invention is described further hereinafter, by way of example only, with reference to the accompanying drawings, in which:

FIG. 1 is a sectional view of one embodiment of a typical magnetostrictive transducer;

FIG. 2 is an exploded sectional view of a typical piezo-electric transducer;

FIG. 3 is a schematic of a typical conventional layout for magnetostrictive transducers on a diaphragm plate;

DESCRIPTION OF THE PREFERRED EMBODIMENT

Figure 4A:
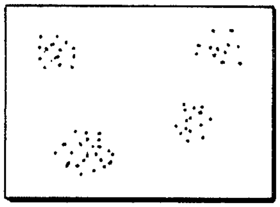
FIG. 4 diagrammatically illustrates the different cleaning efficiencies of different systems.

The typical magnetostrictive transducer shown in FIG. 1 comprises a plurality (560 in this instance) of generally U-shaped metal laminations 10 formed into a stack. Each leg of the stack carries a respective coil former 12 bearing a coil 14, the two coils 14 normally being connected in series. The free ends of the arms of the U-shaped laminations 10 are interconnected by a common biassing magnet (permanent magnet) 16 which imposes a permanent strain in one direction above which a full-wave oscillation can take place when the transducer is energised by a sinusoidal current applied to the coil. The operational necessity for bias in this, or some other manner, is well known and will not be described further. The base of the U-shaped stack is permanently bonded, for example by brazing at 18, to a metal diaphragm plate 20, which, in use, is adapted to be rigidly coupled to the side or base of a tank containing liquid and the article(s) to be ultrasonically cleaned.

The piezo-electric transducer of FIG. 2 comprises a pair of annular piezo discs 22,24, separated by a pair of phosphor-bronze washers 26,28 and a brass electrode 30, and clamped rigidly and coaxially to an aluminium diaphragm plate 32 by means of a mild steel cap 34 and a cap screw 36. A nylon bush 38 is used to centre the cap screw 36. A further phosphor bronze washer 23 is disposed between the piezo-element 22 and the cap 34. A still further phosphor-bronze washer 40 and a further brass electrode 42 are disposed between the element 24 and the plate 32. In use, a high alternating voltage is connected across the electrodes 30 and 42.

FIG. 3 shows a typical layout for a plurality of magnetostrictive transducers 44, of the type illustrated in FIG. 1, on the diaphragm plate 20. In the conventional use of such a system, the pairs of terminals AA and BB are connected to separate pairs of amplifier modules AMP1, AMP2 and AMP3, AMP4, operating at a preset fixed frequency in the range 20–21 KHz. As explained hereinbefore, a principal problem in practice in the use of such a system is that in order to achieve useful efficiencies for the system it is essential that the individual transducers are operated at mechanical resonance. This is simply not possible to achieve for any useful period of time, if at all, with the existing generator system as a result of the physical changes which occur during operation, such as the dimensional changes in the transducer components due to temperature variations.

The present system overcomes, or at least largely mitigates, this problem by a combination of two techniques which will be referred to hereinafter as "frequency sweep" and "autofollow", respectively. These two techniques will be described first in general terms and then a detailed explanation in connection with a specific embodiment will then be provided.

Figure 4B:
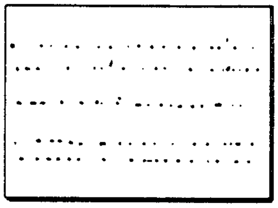
Figure 4C:
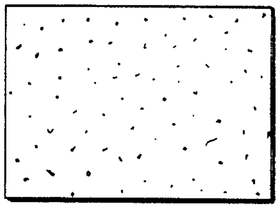

"Frequency sweep" refers to a technique of continuously varying the oscillation frequency above and below a pre-set centre frequency, e.g. from a high of 22 KHz to a low of 20 KHz about a centre frequency of 21 KHz. Frequency sweep as used previously, (see the present applicant's prior U.K. Pat. No. 1 572 186) has had two main functions. The first function has been to overcome the stratification effect found in single-frequency cleaning systems in which the energy of cavitation is concentrated in bands spaced apart by distances corresponding to the wavelength of sound in the cleaning solution (liquid) and caused by the sound waves being reflected from the surface of the liquid setting up nodes and anti-nodes to form a standing-wave pattern. This pattern can be demonstrated (in accordance with a conventional technique) by inserting into the cleaning liquid a length of aluminium foil, typically for one minute, which then displays rows of pin-holes and indentations whose positions correspond to and identify the cavities being created in the liquid. FIG. 4*a* shows the typical result of such a test with a magnetostrictive system operating with fixed frequency drive. By way of contrast, FIG. 4*b* shows the result using a piezo system with a fixed frequency. FIG. 4*c* shows the result for the piezo system but incorporating "frequency sweep".

The standing wave effect (FIGS. 4*a* and 4*b*) results in non-uniform cleaning of the component immersed in the liquid and is particularly pronounced in larger industrial systems. Delicate items can sometimes even be damaged by the establishment of "hot-spots". This is combatted normally by raising and lowering the component to be cleaned, so creating disturbance in the liquid.

A frequency sweep system will accomplish the same end by disturbing or preventing the standing wave pattern from being set up, without the need for mechanical handling methods for displacing the component itself.

Another known advantageous effect of "frequency sweep" is that it provides a faster and more thorough cleaning performance. This is achieved by its ability to enable higher peak electrical powers to be generated for the same average power handled by the generator and transducer array as that in a comparable single-frequency system. This is achieved as follows. One conventional technique used to improve single-frequency systems is to amplitude modulate the D.C. power supply to the generator oscillator, for example at a frequency of 100 Hz. This has the effect of providing the resulting oscillations with a 100 Hz envelope. For example a 30 KHz oscillation of fixed amplitude may provide an average power of 500 watts and a peak power of the same value. However, the same 30 KHz oscillation if amplitude modulated at 100 Hz can still provide an average power of 500 watts while providing peak power of, say, 1,000 watts. Amplitude modulation is conventionally achieved simply by omitting (or reducing to a small value) the filter capacitors in the main rectification section providing the D.C. supply to the power oscillator.

If frequency sweep is added to an already amplitude modulated system then the high frequency envelope itself experiences peaks and troughs, resulting in the availability of even greater peak powers for the same average power.

Clearly, in the latter example, the generator has to be designed to handle greater than the 1,000 watt peak power occurring at the peaks of the rectified D.C. and transistors in the oscillator have to be selected for appropriate peak power capability. The important factor is that the generator components and transducer need handle only 500 watts average power, and so do not overheat.

Figure 5:
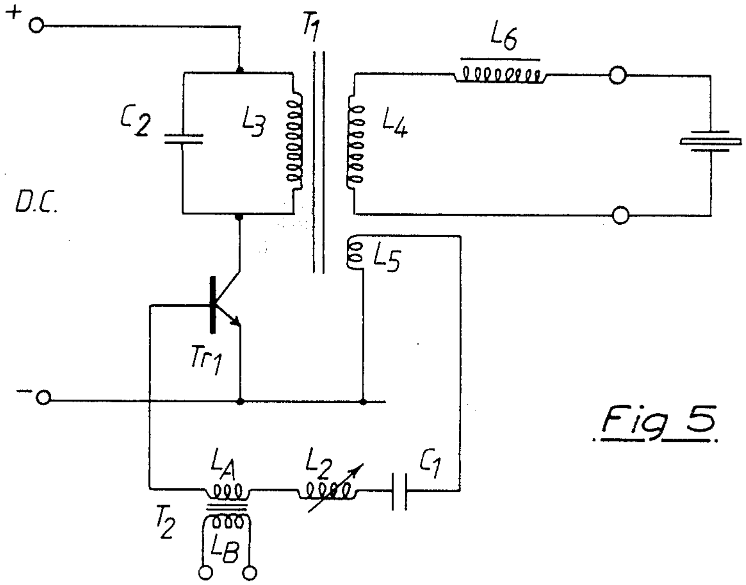
FIG. 5 illustrates the technique known as frequency sweep.

FIG. 5 shows an example of a known sweep frequency arrangement, invented by the present applicant, applied to a piezo-electric transducer.

The parallel combination of a capacitor C2 and inductance $L_3$ is disposed in series with the collector-emitter path of an NPN transistor $Tr_1$ across a D.C. supply. Inductance $L_3$ is the primary winding of a transformer $T_1$ having secondary windings $L_4$ and $L_5$. $L_4$ is connected via an inductance $L_6$ to a transducer load. $L_5$ is a voltage feedback winding connected to the transistor base via the series combination of a capacitor $C_1$, a fine tuning inductance $L_2$ and a variable inductance $L_A$. The inductance $L_A$ can be varied cyclically by making it the secondary of a transformer $T_2$ having a primary winding $L_B$ connected to the unsmoothed output of a full-wave rectifier (not shown) which applies 100 Hz to $L_B$.

In this sytem, $L_A$ and $C_1$ determine the operating frequency for single frequency operation with $L_2$ as a fine tuner. $L_B$ is used to introduce frequency sweep by changing the inductance of $L_A$ at 100 Hz rate. $L_5$ provides the drive voltage for the feedback circuit and corresponds in shape and frequency to the voltage across $L_3$.

It will be noted that with this sytem, the voltage feedback is independent of loading because it permits oscillation whether the load is connected or not, operating frequency being determined by constants of $L_A$, $L_2$ and C3, modified by LB.

It will also be noted that in order to operate the sweep system, the generator should be in complete control of the system frequency, and this is best achieved by an independent oscillator having voltage feedback from the output transformer, for example as described above.

The term "autofollow", on the other hand, refers to an arrangement where the operating frequency of the oscillator is made to follow some specific predetermined operating characteristic of the system. As described further below, the present application arranges for the operating frequency to be made to vary to maintain the current to the transducers at a maximum level and hence maintain the condition of mechanical resonance.

Figure 6:
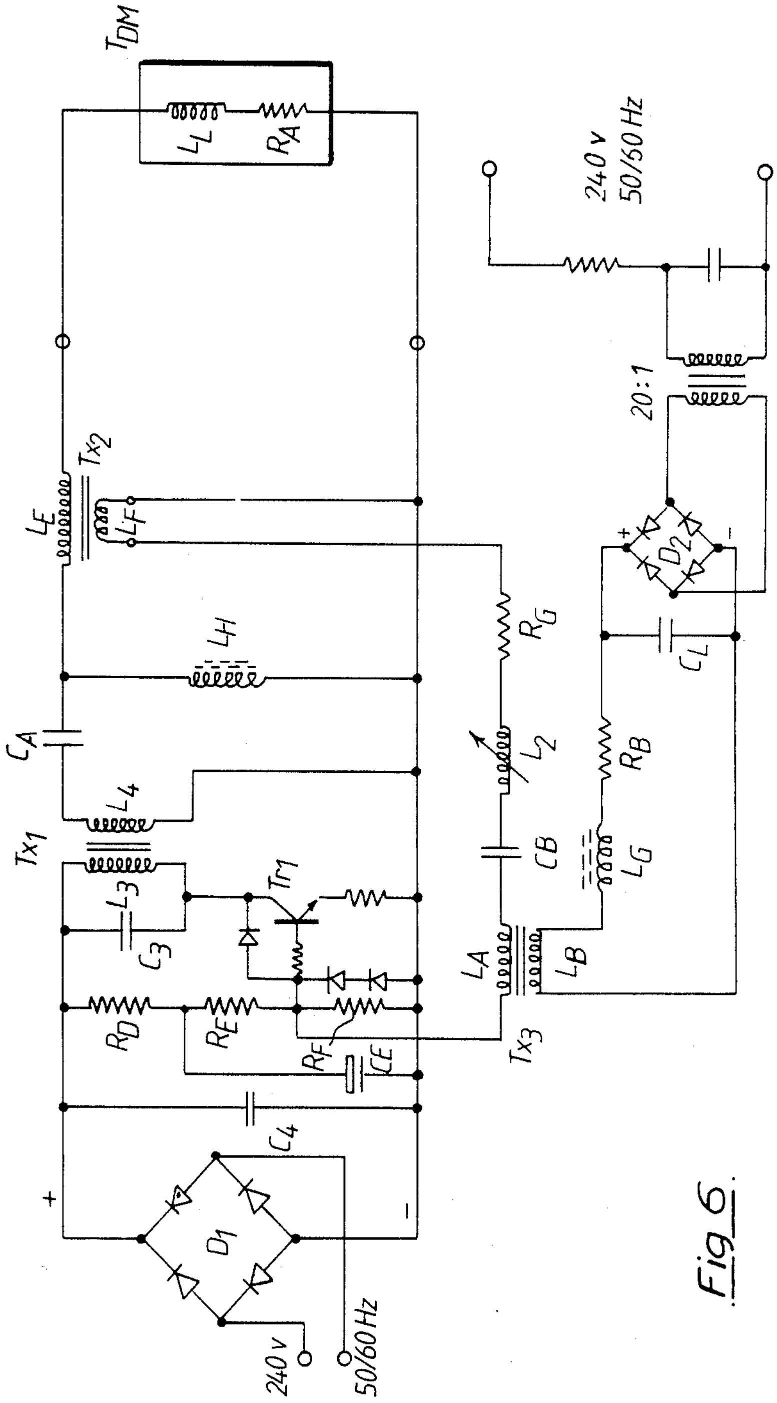
FIG. 6 is a circuit diagram of one embodiment of a generator in accordance with the present invention suitable for driving a multi-transducer load.

Reference is now directed to FIG. 6 which shows one embodiment of a generator system in accordance with the present invention. Although this system is described in relation to the control of magnetostrictive transducers, it is to be understood that, it could equally well be used to drive piezo transducers. The generator system comprises a power oscillator which includes the parallel combination of a capacitor $C_3$ and inductance $L_3$ in series with the emitter-collector path of a transistor $Tr_1$ across a D.C. supply provided by a full wave rectifier $D_1$. The smoothing capacitor $C_4$ is of sufficiently small value that the D.C. is modulated at 100 Hz to provide the amplitude modulation effect described above.

Base bias for the transistor $Tr_1$ is provided by means of resistors $R_D$, $R_E$ and $R_F$. A capacitor $C_E$ connects the junction of $R_D$ and $R_E$ to the negative rail providing a switch-on surge protection.

The inductance $L_3$ forms the primary of a transformer $Tx_1$ having a secondary winding $L_4$ (the turns ratio of $L_3/L_4$ can be for example 1:1) connected to a transducer load TDM via a capacitor CA and an inductance $L_E$. The transducer is assumed here to be of the magnetostrictive type and is represented by the series combination of a 1 mH inductance $L_L$ and a 100 Ω resistor $R_A$. The inductance $L_L$ might, for example, increase to 1.5 mH with liquid temperature.

To provide "autofollow", the inductance $L_E$ is made the primary of a transformer $Tx_2$ having a secondary $L_F$ whose one end is connected to the negative rail and whose other end is connected to the base of transistor Tr1 via a series combination which includes a resistor $R_G$, a trimmer inductor L2, and a capacitor CB. This circuit operates to provide current feedback to the transistor that is dependent entirely on the current passing through LE and hence on the current in the load TDM. $C_B$ is a high value blocking capacitor to prevent DC from entering $L_F$; it has no frequency determining function. From consideration of FIG. 6, it will be appreciated that the prime frequency determining element is the load TDM itself and that the system will allow feedback currents only at the resonant frequency of the transducer, i.e. the feedback current seeks to maximise the current in the load $T_{DM}$. Consequently, if the resonant frequency of the load $T_{DM}$ changes, for example due to temperature changes, then the generator frequency will automatically adjust to this new frequency.

Some phase correction may be needed to ensure that the input to the transistor is in accurate anti-phase relationship to its output, as a result of unwanted slight phase shifts in other components in the loop. $L_2$ is provided for such correction.

The use of the autofollow technique in this manner enables the system to maintain high efficiency when using a single transducer, by operating the transducer so that it is constantly at mechanical resonance. In such a case, if the dimensions of the mechanical system alter for whatever reason, then a corresponding change in the frequency of the electrical drive ensues to maintain the resonant condition.

However, in a practical system, there would as described above, be more than one transducer and in this event the autofollow circuit would adjust the generator frequency for the highest level of output current and this can only be that frequency that produces the highest summation of currents to the group of transducers. However, it could be that only one, or even none, of the transducers is operating precisely at its resonant frequency and thus the operational efficiency would still be likely to be low.

The present application has discovered that this problem can be overcome by combining with the autofollow technique described above the frequency sweep technique described initially. For this purpose, the feedback loop to the transistor $Tr_1$ includes the secondary $L_A$ of a transformer $Tx_3$ whose primary $L_B$ is connected via an inductor $L_G$ and a resistor $R_B$ to a substantially unsmoothed full-wave rectifier circuit $D_2$ driven via a step-down transformer (for example 20:1) from the main supply. The primary winding $L_B$ is thereby subjected to a 100 Hz signal which is effective to vary the inductance of $L_A$ sufficient to cyclically sweep the frequency of oscillation of the transistor $Tr_1$ from, for example, 20.0 KHz to 20.2 KHz. This is found in practice to be sufficient to encompass the resonant frequencies of all transducers in a batch.

What is achieved, therefore, is a servo system that automatically finds the centre frequency of a transducer batch, each member of which may have a slightly different resonant frequency from every other member, together with a frequency sweep from that centre frequency which ensures that each transducer is "peaked" in turn repetitively. The system is able to follow the centre resonance as the physical dimensions of the transducer change with operational temperature or other resonance changes occurring due to tank loading.

On consideration of the initial discussion of the autofollow and frequency sweep techniques, it is surprising that these two techniques can be successfully combined in the described manner since they would appear in theory to be mutually contradictory. One would expect that, using the autofollow technique, once correct phasing had been established the circuit would not admit the introduction of a frequency sweep as it apparently would produce instability or failure to work at all. Thus, it had been considered previously that voltage and current feedback systems were mutually exclusive, voltage feedback being useless for autofollow because it does not sense the output current which maximises at the resonant frequency of the transducer and current feedback, since this is powerfully determined by the load, being non-variable in frequency without instability and/or failure.

It has been established in practice by the present Applicant, however, that the two techniques can be combined without any instability or failure provided that the tuning/phase correction circuit composed by $L_A$, $L_2$ and $C_B$ has a low Q factor and that the magnitude of the sweep established vai $Tx_3$ is relatively low. However, since the variation in frequency from the centre frequency necessary to encompass all of the resonant frequencies of the transducers is also of the same low order then the variation capable of being achieved is quite sufficient for the present purposes.

One way of establishing the necessary frequency variation in practice is to gradually wind the turns of $L_B$ onto $Tx_3$ a few turns at a time, checking for uniformity of aluminium foil patterning (FIG. 4*c*), and observing the generator output shape whilst simultaneously checking that the autofollow mechanism is still effective.

Partial temperature compensation against drop in output power which occurs as the transducer electrical inductance increases with temperature, and which would result in a drop in output power, is obtained by shunting the output with an inductance $L_H$, the latter device being of course unaffected by the liquid temperature in the tank but being nevertheless part of the load impedance. $L_H$ has a second function also, this being to help match the load acoustic resistance $R_A$ to $Tx_1$. This it does by being in parallel with the load and therefore effectively reducing the value of $R_A$ as seen by $Tx_1$.

The combination of frequency sweep and autofollow has been found to produce a dramatic improvement in cleaning performance—both in cavitation intensity and in uniformity of cavitation within the cleaning liquid. This is especially important in magnetostrictive systems such as the one described above which, because of the relatively low transducer efficiency, must operate at or very close to resonant frequency throughout—a requirement virtually impossible to be met by a fixed frequency drive from a low level oscillator, and still not met by an autofollow circuit or frequency sweep circuit operating alone. Operating in combination, however, the autofollow circuit sets the generator centre frequency at an optimum level (maximum output current) and the frequency sweep circuit provides a second order control to ensure that all transducers are periodically peaked. Thus, for example, when banks of transducers are interchanged using the same generator, the centre operating frequency is changed automatically to suit the new bank, the sweep action compensating for the various resonant frequencies of individual transducers within the batch.

I claim:

1. An ultrasonic generator for driving a plurality of ultrasonic transducers, comprising:
- an electronic oscillator which provides an A.C. signal for driving said transducers;
- autofollow means, responsive to the current supplied to the transducers, for varying the oscillator frequency to maintain the transducer current at a maximum level; and
- frequency sweep means, which operates independently of said autofollow means, for cyclically sweeping between upper and lower limits the oscillator frequency determined by said autofollow means.

2. An ultrasonic generator for driving a group of series connected ultrasionic transducers, comprising:
- an autofollow servo means for automatically finding and following that operating frequency which maximizes the current accepted by said group of transducers; and
- a secondary control frequency sweep means for cyclicallly varying said operating frequency about the value set by said autofollow servo means to ensure that each transducer of the group experiences mechanical resonance at least once in each secondary frequency sweep control cycle.

3. An ultrasonic generator for driving a group of series connected ultrasonic transducers, comprising:
- (a) a feedback-controlled oscillator means for providing an A.C. signal for driving said group of transducers;
- (b) autofollow means, responsive to the current supplied to the transducers, for varying the oscillator frequency to maintain the transducer current at a maximum level;
- (c) said autofollow means including a first transformer whose primary winding is disposed in series with said group of transducers and whose secondary lies in a feedback path controlling the oscillator frequency; and
- (d) frequency sweep means, which operates independently of said autofollow means, for cyclically sweeping between upper and lower limits the oscillator frequency determined by said autofollow means;
- (e) said frequency sweep means including a second transformer whose secondary is disposed in said feedback path and whose primary is subjected to an oscillating signal which causes the inductance of the primary winding in said feedback path to vary in a correspondingly cyclic manner.

4. An ultrasonic generator according to claim 3, wherein said feedback path additionally includes a variable trimmer inductance which enables the phase of the feedback signal to be adjusted.

* * * * *